US006565917B1

United States Patent
Reddy et al.

(10) Patent No.: US 6,565,917 B1
(45) Date of Patent: May 20, 2003

(54) METHOD OF FORMING FEATURES ON A CERAMIC SUBSTRATE USING PLATIBLE PASTES

(75) Inventors: Srinivasa S. N. Reddy, Lagrangeville, NY (US); Donald R. Wall, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/525,472

(22) Filed: Mar. 15, 2000

Related U.S. Application Data

(62) Division of application No. 09/071,409, filed on May 1, 1998, now Pat. No. 6,068,912.

(51) Int. Cl.[7] .......................... B05D 5/12; C23C 16/00
(52) U.S. Cl. ..................... 427/99; 427/97; 427/250; 427/255.11; 427/124
(58) Field of Search ................. 427/97, 99, 124, 427/126.2, 255.11, 402

(56) References Cited

U.S. PATENT DOCUMENTS

| | | | |
|---|---|---|---|
| 4,194,673 A | | 3/1980 | Elbert et al. |
| 4,340,618 A | * | 7/1982 | Fury et al. ................ 427/96 |
| 4,664,942 A | * | 5/1987 | Park ........................ 427/57 |
| 4,835,039 A | * | 5/1989 | Barringer et al. ........... 428/210 |
| 5,161,728 A | | 11/1992 | Li |
| 5,230,924 A | | 7/1993 | Li |
| 5,248,079 A | | 9/1993 | Li |
| 5,293,504 A | | 3/1994 | Knickerbocker et al. |
| 5,422,190 A | | 6/1995 | Alexander |
| 5,698,015 A | | 12/1997 | Mohri et al. |
| 5,787,578 A | | 8/1998 | Farooq et al. |
| 5,869,134 A | * | 2/1999 | Reddy et al. ............... 427/250 |

FOREIGN PATENT DOCUMENTS

| | | |
|---|---|---|
| JP | 55-27841 | 2/1980 |
| JP | 63-89481 | 4/1988 |
| JP | 1-501465 | 5/1989 |
| JP | 3-252380 | 11/1991 |
| JP | 4-16578 | 1/1992 |
| JP | 8-32242 | 2/1996 |
| JP | 8-91969 | 4/1996 |
| JP | 8-231288 | 9/1996 |
| JP | 10-22594 | 1/1998 |
| JP | 10-68075 | 3/1998 |

* cited by examiner

*Primary Examiner*—Brian K. Talbot
(74) *Attorney, Agent, or Firm*—Margaret A. Pepper

(57) ABSTRACT

A paste for one of a via and an external feature, such as a pad, tab, or line, of a ceramic substrate, includes at least one of titania and zirconia, and a filler material mixed with the at least one of titania and zirconia. Further, the via structure or external feature such as an input/output pad, tab, or line, includes a metallic plating thereover. A method of forming the via structure or the external feature on the ceramic substrate, includes steps of either depositing the paste in the via of the ceramic substrate or depositing the paste on the ceramic substrate, and depositing, by a dry process metallic plating, a metallic plating on the paste. The paste includes at least one of titania and zirconia for reducing residual stress without effecting the platability of the metallic plating.

21 Claims, 2 Drawing Sheets

METHOD OF FORMING FEATURES ON A CERAMIC SUBSTRATE USING PLATIBLE PASTES

The present Application os a Divisional Application of U.S. patent application Ser. No. 09/071,409, filed on May 1, 1998 now U.S. Pat. No. 6,068,912.

BACKGROUND OF THE INVENTION

The present invention generally relates to a screening paste, and more particularly to a platible non-metallic filler material for use in metallurgical screening pastes used in a via structure for a ceramic electronic packaging or used in forming an external feature such as an input/output (I/O) pad, tab, wire band pad, sealed band, lines, and the like.

DESCRIPTION OF THE RELATED ART

In the ceramic electronic packaging technology, a problem may arise if a via structure is placed too closely to another via structure on the top or bottom of a substrate, and where the via diameter is greater than a predetermined size for the separation distance. Specifically, a radial crack may propagate between the two vias.

To maximize the utility of any substrate, a designer will pack electronic features as closely together as possible. However, ground rules must be established that maintain appropriate distances such that cracks will not form and propagate between vias.

In addition to maintaining appropriate spacing, another technique to avoid via-to-via cracks has been to include "stress relief vias" in the design. These vias are designed to preferentially crack and relieve stress so that "live" vias in the matrix do not crack.

However, a problem with stress relief vias is that they take up valuable "chip real estate" on the design surface without providing any electronic function. Therefore, the designer is limited by having to include stress relief vias in the design and loses chip space which otherwise would be available for other components and functions.

In an attempt to minimize potential cracks to be initiated and propagate between vias, one approach has been to include in the via the metallurgical paste constituents that alter the overall effective thermal coefficient of expansion (TCE) of the via, such that it more closely approximates the TCE of the ceramic body of the substrate. Generally, these "filler" materials are high-melting point metal oxides that will not react chemically with the metal particles in the paste (e.g., the via paste) during sintering. Otherwise, such interaction would compromise the final electrical characteristics of the conductive lines and vias in the fired substrate of the chip.

Additionally, generally, the more filler material that is added to the metallurgical paste, the less likely it becomes for via-to-via cracks to form, given that other geometrical arrangements are maintained constant for the comparison.

However, simply adding additional amounts of non-metallics to the metallurgical paste is problematic for several obvious reasons. Specifically, the screenablity of the paste, its final conductivity, densification behavior, etc. are affected by indiscriminately adding additional amounts of non-metallics.

Moreover, one of the main limiting constraints is the platibility of the fired metallurgical paste. Oftentimes, refractory metals such as tungsten and molybdenum are used as the conductive materials for substrate metallization, because of the high sintering temperatures (e.g., about 1500–1600° C. for alumina substrate) required for many ceramics (e.g., especially alumina). Refractory metals such as tungsten and molybdenum can tolerate such high temperatures.

However, a problem arises since refractory metals such as tungsten and molybdenum are not directly brazable or solderable due to their surface wettability. Generally, the external terminal refractory metal features, pads, and vias first must be plated with a metal which is brazable and solderable and which also can be made to bond with molybdenum and tungsten. Usually, nickel is used as the plating metal, and the common processes used for plating external features with nickel are electroplating and electroless plating in a wet bath.

Besides these two common plating processes (e.g., electroplating and electroless plating), a relatively new process has been developed which plates electrolessly a nickel film via a dry chemical vapor deposition (CVD) process. Variations of this method are disclosed in U.S. Pat. No. 4,664,942 and in U.S. Pat. No. 5,869,134, both incorporated herein by reference.

However, for many plating applications of terminal features such as those discussed above, the nickel coating film must cover completely the underlying refractory metal termination, so that even pin holes in the nickel coating film are reduced or eliminated.

Additionally, since the metallurgical paste was purposely formed to contain non-metallics, it is difficult to successfully plate the refractory metal terminations and simultaneously cover completely all the non-metallic non-platible inclusions in the metallurgical paste. This difficulty especially arises in the new CVD process referred to above. Specifically, the CVD deposition tends to grow vertically rather than horizontally, thereby requiring a very thick nickel film deposition, so as to ensure the complete coverage of all non-metallic, non-platible constituents.

Thus, in the conventional methods, a trade-off must be made between: 1) how much non-metallic can be added to a paste so as to reduce via-to-via cracks and improve design; and 2) how much non-metallics must be limited in order to completely cover these non-metallic inclusions during plating.

It is noted that one of the most significant features raising many difficulties is a via, such as a C4 via, which has a very small diameter and tight spacing so as to match an I/O grid of a semiconductor device. It is known that, if any pin holes exist in the nickel film covering the C4 via, then voids in the solder attachment therefor may form. These voids cause reliability problems and reduce the fatigue life of the solder connection between the chip and the substrate.

Thus, the conventional methods result in more restrictive ground rules, the inclusion stress relief vias which take up valuable chip real estate, and/or thicker Ni films which result in various problems.

It is noted that, for example, as the Ni films get thicker, less uniformity results.

Further, in a typical DP nickel plating process, the interface which secures the I/O pads is glass, with "glass fingers" being formed by the glass flowing during the sintering operation. However, the glass is subsequently affected by the iodide atmosphere inherent to the Ni plating operation. Specifically, as thicker Ni films are plated, a greater time is required in a hightemperature environment, and a greater time that the glass is exposed to the iodide atmosphere. The iodide environment attacks the glass fingers. Thus, the glass and its bonding ability are affected by the high temperatures used and associated with the thicker Ni film.

Additionally, thicker films result in greater costs.

Yet another problem is that I/O pad adhesion generally is not optimized in the conventional DP Ni plating process.

SUMMARY OF THE INVENTION

In view of the foregoing and other problems of the conventional methods and structures, it is a purpose of the present invention to provide a method and structure in which the amount of non-metallics to be added to a paste is optimized so as to reduce via-to-via cracks and improve design, but also so that these non-metallics can be completely covered during plating.

Another purpose is to provide a method and structure in which a via (e.g., a C4 via) having a very small diameter and tight spacing is efficiently produced such that pin holes in a film (e.g., Nickel) covering the C4 via are minimized, and thereby voids in an attachment mechanism (e.g,. solder) are prevented.

Yet another purpose is to provide a method and structure in which a fatigue life of a solder connection between chip and substrate is maintained.

A further purpose is to provide a structure and method which is less costly and provide more design options than providing stress relief vias, and which further provides a high-quality plating with low thickness, and improved ground rules.

In a first aspect of the present invention, a paste for one of a via and an external feature of a ceramic substrate, includes at least one of titania and zirconia, and a filler material mixed with the at least one of titania and zirconia.

In a second aspect of the present invention, a via structure for a ceramic substrate, includes a paste including at least one of titania and zirconia, and a metallic plating over the paste.

In a third aspect of the invention, a method of forming one of a via structure and an external feature on a ceramic substrate, includes steps of: one of depositing a paste in a via of a ceramic substrate and depositing the paste on the ceramic substrate, and depositing, by a dry process metallic plating, a metallic plating on the paste. The paste includes at least one of a titania and zirconia additive for reducing residual stress without effecting the platability of the metallic plating.

With the unique and unobvious aspects and features of the method and structure of the present invention, tighter ground rules result, and the requirement for stress relief vias is minimized, if not eliminated. Further, a thin Ni film results which allows for a more compact structure, better performance, and a more efficient manufacturing process. Additionally, a lower cost process results, a more uniform Ni plating is achieved, and the I/O pad adhesion is affected less than (and thus is not as problematic) the conventional structures.

Further, the present invention optimizes the amount of non-metallics to be added to a paste (e.g., a via paste), so as to reduce via-to-via cracks and improve design and also so that these non-metallics can be completely covered during plating.

BRIEF DESCRIPTION OF THE DRAWINGS

The foregoing and other purposes, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1A:
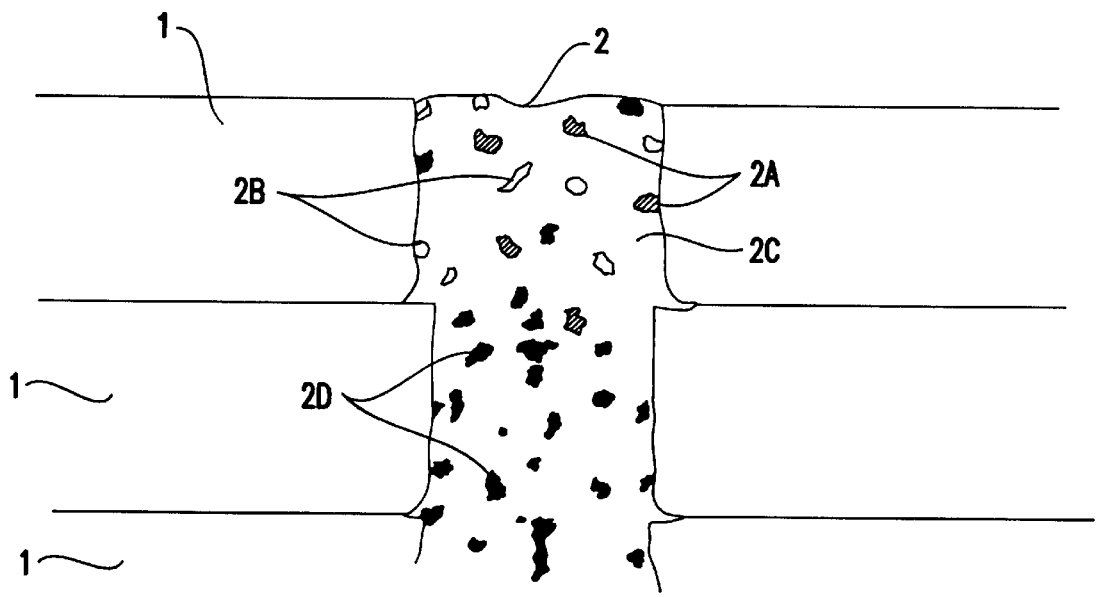
FIGS. 1A–1B illustrate steps of a method of a preferred embodiment for manufacturing a via structure with a paste according to the present invention, with FIG. 1B illustrating a finished product resulting from the method according to the present invention.
Figure 1B:
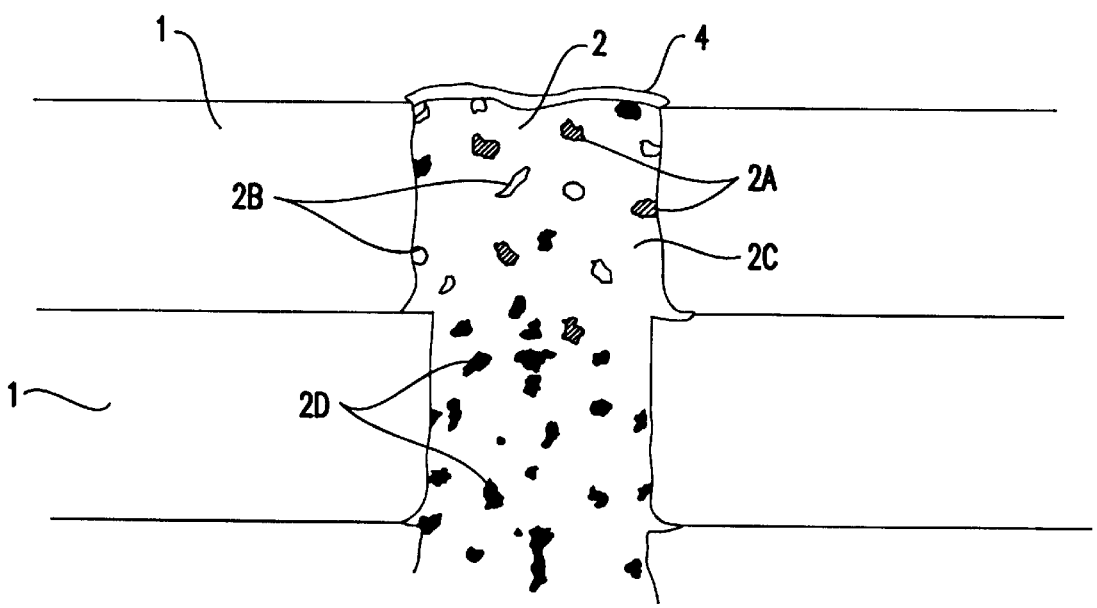
Figure 2A:
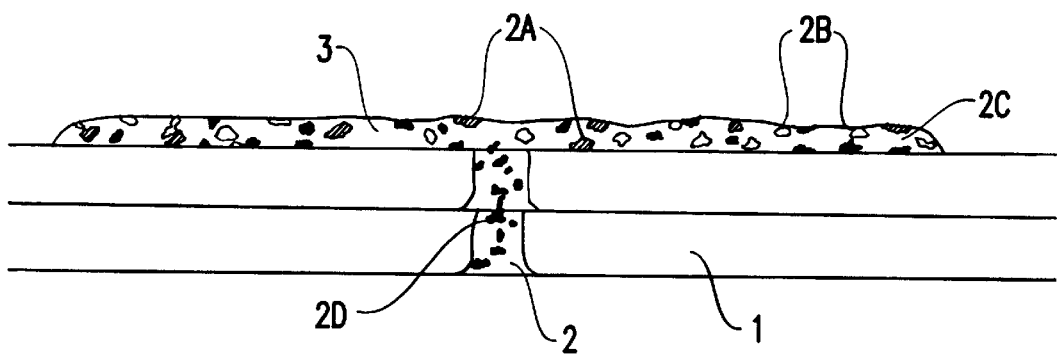
FIGS. 2A–2B illustrate steps of a method of a preferred embodiment for manufacturing an external feature such as, for example, an input/output (I/O) pad, with a paste according to the present invention, with FIG. 2B illustrating a finished product resulting from the method according to the present invention.
Figure 2B:
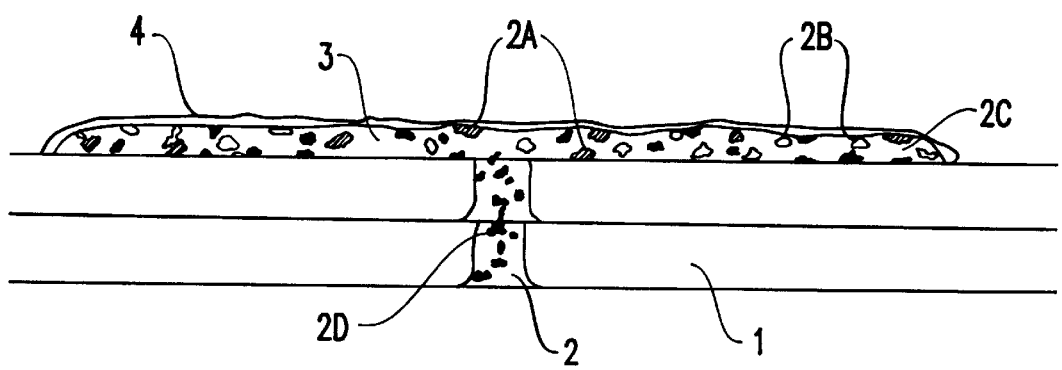

Referring now to the drawings, and more particularly to FIGS. 1A–1B, there is shown a preferred embodiment of the method and structure according to the present invention for forming a via structure on a substrate using a paste according to the present invention, whereas FIGS. 2A–2B show a feature such as, for example, an I/O pad, a line, tab, a sealed band, a wire bond pad, etc. on a substrate using a paste according to the present invention.

It is noted that the present invention is optimized for the dry process (DP) nickel plating described above. The present inventors found that DP nickel does not bridge as well over non-metallics as other nickel plating does (e.g., wet nickel plating).

Prior to turning to the inventive paste, a general operation of forming a substrate is described.

Generally, to form a substrate, a conventional method is utilized including forming a "green sheet" including ceramic particles held together by an organic binder. The green sheet is punched out to personalize the green sheet with holes (e.g., vias). The holes/vias are screened with pastes (e.g., as is known, the vias extend in the Z-direction). The pastes (e.g., used for both vias and I/O pads) generally are made by an organic vehicle.

Thereafter, X-Y lines are screened, and a plurality of such personalized green sheets are stacked, and laminated at an appropriate temperature (e.g,. 70° C.). Typically, the top and/or bottom of the laminated structure will have I/O pads attached thereto at suitable locations. Thereafter, the entire structure is baked (e.g,. co-fired) to remove the organic materials and to sinter the metallic and ceramic features. In this step, the I/O pads become securely bonded to the fired substrate. This is done basically by the glass in the pad reflowing and making contact with the glass in the substrate to form "finger links", to secure the electrical conductive pad to the ceramic substrate.

Turning first to FIG. 1A, there is shown a substrate I made of ceramic material or the like. As evident, FIG. 1A represents the ceramic substrate after sintering, but before subsequent nickel plating. Typically, the substrate includes many layers of ceramic material, although for brevity and easy understanding for the reader only three layers are shown in FIG. 1A. Within the substrate 1 is a via 2. It is noted that the exposed surface of the via shown is the top or bottom of the ceramic substrate, as it is the substantial top or bottom of the via which require special consideration, and hence will find benefit especially with the paste of the present invention. Typically, the paste (e.g., via paste, line paste, etc.) on the inside (internally) of the ceramic structure may be pure metal (e.g., molybdenum) for increased electrical characteristics. However, as mentioned above, the substantial top and bottom of the substrate which will receive a plating for the via or other external features such as an I/O pad, will obtain special consideration.

Via 2 includes a paste formed by titania and/or zirconia 2A, along with any one or more of a plurality of standard filler materials such as alumina or sub-micron alumina 2B, molybdenum 2C, glass 2D, etc. Glass is an important component of the via paste since, as described above, it easily flows at elevated temperature to perform a bonding and securing function. It is noted that if no glass is present in the filler material in the paste, glass particles from the ceramic substrate will tend to flow and migrate into the via during formation (heating) of the structure.

Thereafter, as shown in FIG. 1B, a dry process (DP) nickel plating is performed over the exposed surface layer of the via 2 to coat and plate. the same. The DP nickel plating process is selective, and forms only on the metallic refractory metal being plated (e.g., only over the via, not over the ceramic substrate material).

Thus, the present invention solves the above and other-problems of the conventional methods and optimizes the amount of non-metallics which can be utilized in structures.

Specifically, the present invention utilizes an oxide such as, for example, titania and/or zirconia additive to via pastes on an outer layer of, for example, a multi-layer ceramic (MLC) substrate. The oxide additive reduces residual stress (e.g., via-to-via cracking) without effecting the platability of DP Ni.

More specifically, the present invention utilizes non-metallic filler materials in the paste that are platible intrinsically by the nickel plating process similarly to the refractory metals. For example, titania and/or zirconia probably react with Ni at the interface.

A plurality of non-metallic filler materials in the paste which can be plated externally with nickel by either of the CVD processes discussed above, can be used in the present invention.

For example, titania ($TiO_2$) and zirconia ($Zr_2O_3$) can be plated externally with nickel (e.g., pure nickel is deposited, but the nickel alloys with molybdenum especially at small thicknesses to obtain a Ni-molybdenum alloy at the surface) by either of the CVD processes discussed above. Metallurgical pastes can be made containing appropriate amounts (e.g., about 12 volume percent (%) titania (and/or zirconia), 12 volume percent sub-micron alumina, with the remaining being molybdenum) of one or both of these materials in combination with appropriate amounts of other traditional filler materials such as alumina or sub-micron alumina, and screen parts by traditional processing.

Once again, it is noted that what constitutes "appropriate amounts" depends on the application and use of the paste. Even for the conventional pastes for example, about 8–12 volume percent non-metallics may be suitable for a surface via. However, for an I/O pad, there should be more non-metallics (e.g., an optimum amount may be about 23 volume percent). Thus, for the conventional pastes for example, a suitable range of non-metallics may be 8–30 volume percent depending on the application. As discussed in further detail below, the present invention widens this range of non-metallics since the non-metallics within the structure are being plated and are active with the DPN plating process.

Thereafter, a dry processing (DP) Nickel process is performed for coating refractory metal terminal features. It is noted that the present invention does not necessitate any changes in the operating environment or any critical parameters in the methods described in the above-mentioned U.S. Pat. Nos. 4,664,942 and 5,864,134.

The present inventors have discovered that substantially complete coverage of non-metallics included in metal termination by a nickel film can be achieved at significantly reduced thicknesses (e.g., about 0.1–12 $\mu$m) of nickel film for significantly increased amounts of non-metallic in the pastes. For example, for conventional structures utilizing a paste with a conventional amount of non-metallics therein, for example, about 12 volume percent alumina, and with a nickel plating of about 1–2 $\mu$m nickel plating, about 5–10 volume percent of the via will not be covered. In contrast, with the invention utilizing for example, about 12 volume percent titania and about 12 volume percent sub-micron alumina, only about 1 volume percent of the via will not be covered.

Additionally, with the present invention, it has been shown that these vias made by such pastes are less likely to form via-to-via cracks as expected due to the increased amount of filler material in the paste.

In a preferred embodiment, a paste was made with about 12 volume percent titania, about 12 volume percent sub-micron alumina (SMA), and the rest molybdenum, which compares to a typical top-side metallurgy (TSM) paste formulation of only about 12 volume percent total non-metallics (e.g., RGT formulation which is a reference to standard screening paste utilizing, for example about 12 volume percent of non-metallics made of alumina and some glass). It is noted that there is no different between making and applying the paste containing titania as opposed to that containing alumina as in the conventional paste. Specifically, the titania is merely substituted for alumina without any change being required to the operating parameters or conditions involved.

This paste was fully covered with Mickel using a DP Ni process, as described in U.S. Pat. No. 4,664,942 and in U.S. Pat. No. 5,869,134, with a film thickness of, for example, about 1–2 $\mu$m. It is noted that the preferred range is of thicknesses is about 0.1–12 $\mu$m, and a more preferred range is between about 4–6 $\mu$m.

It is noted that the above embodiment should work equally well for 12 volume percent zirconia.

Further, both zirconia and titania could be used in which case the preferred ranges of the zirconia and titania and the other constituents of the via paste could be about 12 volume percent, about 12 volume percent, and about 76 volume percent, respectively. Additionally, it is noted that, while about 12 volume percent is mentioned above, about 12 volume percent is optimum and such a percentage could be more depending upon the application involved. Hence, an applicable range for the present invention may be about 10–45 volume percent of non-metallics, and it is noted that this range is much wider (e.g., broader) than the conventional paste's range of non-metallics (e.g., 8–30 volume percent) because of the platibility of the titania and/or zirconia non-metallics by the dry process nickel (DPN) plating process, as discussed above.

For example, a via, such as a C4 via or other type of via, may utilize about 10–45 volume percent non-metallics, whereas an external feature, such as, for example, an I/O pad, tab, wire bond pad, sealed band, lines etc., may find benefit in utilizing about 25–45 volume percent non-metallic, with one-half of the non-metallic being titania. Thus, instead of alumina or the like as in the conventional paste, the present invention uses titania and/or zirconia which can be bridged easily and which fluxes/flows easily with glass.

In complete and fundamental contrast, to obtain coverage in the conventional via, one-half the concentration of the non-metallic, (e.g,. a film thtickness of at least about 4–6 μm of nickel plating film) is required The new paste was far less likely to exhibit via-to-via crackhs. For example, comparative test results were conducted for via structures including pas tes having about 12 volume percent alumina, about 12 volume percent sub-micron alumina (SMA), about 6 volume percent tita/about 6 volume percent SMA, about 12 volume percent titania, about 6 volume percent titaniahabout 12 volume percent SMA, and about 12 volume percent titania/about 12 volume percent SMA, with the following results:

TABLE 1

| Material | 12% alumina | 12% SMA | 6% titania/ 6% alumina | 12% titania | 6% titania/ 12% SMA | 12% titania/ 12% SMA |
|---|---|---|---|---|---|---|
| % of sites showing cracks | 52% | 50% | 67% | 57% | 27% | 17% |
| Covered | 92–93% | 95% | 99% | 100% | 97% | 99% |

It is noted that the above structures were covered by the same Ni plating with the same thickness for each test, and in a test vehicle which was designed to show sensitivity to cracking and having an 8 mm pitch with no stress relief vias.

As shown, in the embodiment using about 12 volume percent titania/about 12 percent volume SMA, relatively low propensity to cracking was shown (e.g., about 17% of the sites showed via-to-via cracking), combined with good coverage by the nickel plating (e.g., about 99%). In contrast, the RGT formulation having about 12 volume percent aluminum with a small amount of glass showed about 52% of sites having via-to-via cracks.

Thus, the present invention is extremely advantageous by being able to use a thinner Nickel coating film, and further there are other significant advantages by being able to use a high grit paste.

"High grit" represents a higher than normal amount of grit for the application at hand. For purposes of the present invention, "high grit" for a via application represents approximately 12–20 volume percent grit (nonmetallics) of volume of the solid and about 80–88 volume percent molybdenum (or the like) of the volume of the solid. For example, with about 12 volume percent non-metallics, of the about 12 volume percent non-metallics, about 88 volume percent may be alumina and about 12 volume percent may be glass such as silica glass, alumina glass, and/or magnesia glass. For an I/O pad, "high grit" may be about 25–40 volume percent grit (non-metallics). Hence, "high grit" depends on the application. As a result, with the high grit paste using a filler of titania or zirconia, one can either plate more of the surface area of the via (or fabricate the external feature) or can use a thinner Ni.

Specifically, thin film is less costly, has higher processing through-put, requires less capital equipment, uses less material, and results in lower stress in the film, but most importantly a more uniform Ni film over the conventional DP processes. For example, for a C4 via having a diameter of 100 μm across, with the uniformity resulting from the present invention, there would be substantially no growths greater than 3–μm.

A key advantage of a high grit platible paste is that it reduces via-to-via cracks and frees up valuable chip real estate on the surface for more efficient design, tighter ground rules, and fewer (if any) required stress relief vias in the pattern.

Thus, with the present invention, sufficient non-metallics can be added to prevent via-to-via cracks and Ret not so much so as to prevent completely covering over the non-metallic inclusions during plating. Thus, a smaller and more efficient structure results.

Under some conditions, especially those as taught in U.S. Pat. No. 4,664,942, incorporated herein by reference, the CVD process will tend to produce films with non-uniform growths such as nuggets, nodules and ridges. These growths create problems in manufacturability, reliability due to areas for stress to concentrate at the interface, and workability due to incorrect tolerances, pitch, etc. and become significantly more pronounced as the film thickness grows (e.g., about 3–4 μm up to about 20 μm).

Turning to FIGS. 2A–2B, a pad or a tab or a line 3, such as an I/O pad 3, is shown connected to (e.g., formed over) a via 2, as shown and produced in FIG. 1A. Specifically, there is shown a substrate 1 made of ceramic material or the like. As evident, FIG. 2A represents the ceramic substrate after sintering, but before subsequent nickel plating.

Within the substrate 1 is the via 2. The via 2 is not a termination via since it is covered by the I/O pad. Therefore, it requires no special consideration. Paste for the I/O pad 3 is screened over the via and ceramic substrate at appropriate locations as shown in FIG. 2A. As described above for terminal vias, such as C4 vias, I/O pads are screened with a paste formed by titania and/or zirconia 2A, along with any one or more of a plurality of standard filler materials such as alumina or sub-micron alumina 2B, molybdenum 2C, glass 2D, etc. However, total non-metallics in the paste are preferably within a range of about 10–45 volume percent of the paste, greater than for a terminal via, with about 25–35 volume percent being optimum for an external feature such as the paste for I/O pad 3. As noted above, the present invention's range of non-metallics is much wider (e.g., broader) than the conventional paste's range of non-metallics (e.g., 8–30 volume percent) because of the platibility of the titania and/or zirconia by the DPN process, as discussed above.

Thereafter, as shown in FIG. 2B, a dry process (DP) nickel plating is performed over the top layer of the via I/O pad 3 to coat and plate the same with the nickel or alloy thereof 4. The DP nickel plating process is selective, and forms only on the metallic refractory metal being plated (e.g., only over the I/O pad, not over the ceramic substrate material).

While the invention has been described in terms of several preferred embodiments, those skilled in the art will recognize that the invention can be practiced with modification within the spirit and scope of the appended claims.

The present invention is well-suited and valuable to many different applications. Moreover, manufacturers and designers in electronic packaging industry and especially manufacturers of ceramic substrates with molybdenum or tungsten metallization will find special benefit in the present invention.

Further, besides the application with vias (e.g., C4 vias in specific) and I/O pads for connection to ball grid arrays, pin grid arrays, and column grid arrays, the present invention will find great benefit in use in fabricating other external features.

Having thus described our invention, what we claim as new and desire to Secure by Letters Patent is as follows:

1. A method of forming at least one of a via structure and an external feature on a ceramic substrate, comprising:
at least one of depositing a paste in a via of a ceramic substrate and depositing the paste on the ceramic substrate; and depositing, by a dry chemical vapor deposition (CVD) process, a nickel plating on said paste, wherein said paste comprises at least 6 volume percent titania.

2. The method according to claim 1, wherein said nickel plating has a thickness of substantially between a range of about 0.1 to 12 μm.

3. The method according to claim 2, wherein said nickel plating has a thickness of substantially within a range of about 1–6 μm.

4. The method according to claim 3, wherein said nickel plating has a thickness of substantially within a range of about 4–6 μm.

5. The method according to claim 1, wherein said paste comprises non-metallic filler materials that are platable intrinsically by said nickel plating.

6. The method according to claim 1, wherein said paste comprises both titania and zirconia.

7. The method according to claim 1, wherein said paste comprises at least one of alumina and sub-micron alumina.

8. The method according to claim 2, wherein said paste comprises about 12 volume percent titania.

9. The method according to claim 8, wherein said paste further comprises about 12 volume percent sub-micron alumina with a remaining constituent of said paste being molybdenum.

10. The method according to claim 1, wherein said paste comprises about 12 volume percent zirconia.

11. The method according to claim 1, wherein said-paste further comprises non-metallic filler materials, and wherein, for said via structure, a volume percent of said non-metallic filler materials together with said titania is substantially within a range of about 10–45 volume percent of said paste.

12. The method according to claim 1, wherein said paste further comprises non-metallic filler materials, and wherein, for said external feature, a volume percent of said non-metallic filler materials together with said titania is substantially within a range of about 25–45 volume percent of said paste.

13. The method according to claim 12, wherein, for said external feature, a volume percent of said non-metallic filler materials together with said titania is substantially within a range of about 25–35 volume percent of said paste.

14. A method of forming a feature on a ceramic substrate, comprising:

depositing a paste comprising at least 6 volume percent titania on said ceramic substrate; and depositing, by a dry chemical vapor deposition (CVD) process, a nickel plating on said paste.

15. The method according to claim 14, wherein said feature comprises a via in said ceramic substrate.

16. The method according to claim 14, wherein said feature comprises an external feature on a surface of said ceramic substrate.

17. The method according to claim 14, wherein said depositing by a dry CVD process comprises depositing nickel which forms an alloy with a metal in said paste so that said nickel plating comprises a nickel alloy.

18. The method according to claim 14, wherein said nickel plating has a thickness of substantially between a range of about 0.1 to 12 μm.

19. The method according to claim 14, wherein said paste further comprises one of alumina, molybdenum and glass.

20. The method according to claim 1, wherein said paste comprise at least one of titania and zirconia for reducing residual stress without affecting the platability of said nickel plating.

21. A method of forming a feature on a ceramic substrate, comprising:

depositing a paste comprising at least one of titania and zirconia on said ceramic substrate; and depositing, by a dry chemical vapor deposition (CVD) process, a nickel plating on said paste, wherein said nickel plating has a thickness of 12 μm or less and covers at least 97 percent of said paste.

* * * * *